United States Patent
Agarwal et al.

(10) Patent No.: US 9,626,459 B2
(45) Date of Patent: Apr. 18, 2017

(54) DETECTING HOTSPOTS USING MACHINE LEARNING ON DIFFRACTION PATTERNS

(71) Applicant: International Business Machines Corporation, Armonk, NY (US)

(72) Inventors: Kanak B. Agarwal, Austin, TX (US); Shayak Banerjee, Austin, TX (US); Piyush Pathak, Fremont, TX (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 14/162,889

(22) Filed: Jan. 24, 2014

(65) Prior Publication Data

US 2015/0213374 A1    Jul. 30, 2015

(51) Int. Cl.
*G06F 15/18* (2006.01)
*G06F 17/50* (2006.01)
*G06K 9/32* (2006.01)
*G06K 9/62* (2006.01)

(52) U.S. Cl.
CPC ........... *G06F 17/50* (2013.01); *G06K 9/3216* (2013.01); *G06K 9/6269* (2013.01); *G06K 2009/3225* (2013.01)

(58) Field of Classification Search
None
See application file for complete search history.

(56) References Cited

U.S. PATENT DOCUMENTS

| | | | |
|---|---|---|---|
| 6,809,809 | B2 | 10/2004 | Kinney et al. |
| 6,968,288 | B2 | 11/2005 | Macaluso et al. |
| 6,970,292 | B2 | 11/2005 | Kathman et al. |
| 8,079,005 | B2 | 12/2011 | Lai et al. |
| 8,189,195 | B2 | 5/2012 | Den Boef et al. |
| 8,234,603 | B2 | 7/2012 | Bagheri et al. |
| 8,402,397 | B2 | 3/2013 | Robles et al. |
| 8,411,251 | B2 | 4/2013 | Gerhard |

(Continued)

FOREIGN PATENT DOCUMENTS

WO    WO 2008/009931 A1    1/2008

OTHER PUBLICATIONS

Wuu et al., "Efficient Approach to Early Detection of Lithographic Hotspots Using Machine Learning Systems and Pattern matching", SPIE, vol. 7974, 7940U, 2011, 8 pages.*

(Continued)

*Primary Examiner* — Paulinho E Smith
(74) *Attorney, Agent, or Firm* — Stephen R. Tkacs; Stephen J. Walder, Jr.; Steven J. Meyers

(57) ABSTRACT

A mechanism is provided in a data processing system for detecting lithographic hotspots. The mechanism receives a design layout. The mechanism generates spatial pattern clips from the design layout. The mechanism performs a transform on the spatial pattern clips to form frequency domain pattern clips. The mechanism performs feature extraction on the frequency domain pattern clips to form frequency domain features. The mechanism utilizes the extracted features on a set of training samples to train a machine learning classifier model. The mechanism classifies a set of previously unseen patterns, based on frequency domain features of the previously unseen patterns using the trained machine learning classifier model, into hotspots and non-hotspots.

20 Claims, 8 Drawing Sheets

(56) References Cited

U.S. PATENT DOCUMENTS

| | | | |
|---|---|---|---|
| 8,423,544 B2 | 4/2013 | Guo et al. | |
| 8,453,075 B2 | 5/2013 | Guo et al. | |
| 8,464,194 B1* | 6/2013 | Agarwal | G03F 7/70433 716/112 |
| 8,490,030 B1* | 7/2013 | Chiang | G06F 17/50 716/51 |
| 8,601,419 B1* | 12/2013 | Chiang | G06F 17/5081 716/112 |
| 8,627,245 B1* | 1/2014 | Banerjee | G03F 7/70466 716/50 |
| 8,647,893 B1* | 2/2014 | Agarwal | G06F 17/5081 257/E21.522 |
| 8,898,606 B1* | 11/2014 | Abou Ghaida | G06F 17/5081 716/111 |
| 9,053,259 B1* | 6/2015 | Gennari | G06F 17/50 |
| 9,195,535 B2* | 11/2015 | Gutjahr | G06F 11/079 |
| 2008/0046846 A1* | 2/2008 | Chew | G06F 17/5068 716/51 |
| 2010/0122231 A1* | 5/2010 | Agarwal | G03F 1/144 716/53 |
| 2010/0199255 A1* | 8/2010 | Jung | G03F 1/144 716/53 |
| 2010/0321042 A1* | 12/2010 | Agarwal | G01R 31/2853 324/681 |
| 2011/0119642 A1* | 5/2011 | Agarwal | G03F 1/144 716/50 |
| 2011/0154271 A1* | 6/2011 | Agarwal | G03F 1/144 716/50 |
| 2011/0154280 A1* | 6/2011 | Agarwal | G03F 1/70 716/106 |
| 2011/0288671 A1* | 11/2011 | Agarwal | G03F 1/36 700/104 |
| 2011/0288822 A1 | 11/2011 | Veldman et al. | |
| 2012/0040280 A1* | 2/2012 | Agarwal | G03F 7/70433 430/30 |
| 2012/0110521 A1* | 5/2012 | Agarwal | G03F 1/70 716/52 |
| 2012/0317523 A1* | 12/2012 | Agarwal | G03F 1/70 716/52 |
| 2012/0317529 A1* | 12/2012 | Agarwal | G06F 17/5036 716/113 |
| 2013/0003108 A1* | 1/2013 | Agarwal | G03F 7/70466 358/1.15 |
| 2013/0007674 A1* | 1/2013 | Abou Ghaida | G06F 17/5081 716/52 |
| 2013/0031518 A1 | 1/2013 | Robles et al. | |
| 2013/0061183 A1* | 3/2013 | Abou Ghaida | G06F 17/5068 716/52 |
| 2013/0086543 A1* | 4/2013 | Agarwal | G06F 17/5072 716/119 |
| 2013/0159948 A1* | 6/2013 | Agarwal | G06F 17/5081 716/112 |
| 2013/0159955 A1* | 6/2013 | Ghaida | G06F 17/5081 716/119 |
| 2014/0068529 A1* | 3/2014 | Agarwal | G03F 7/70441 716/54 |
| 2014/0075397 A1* | 3/2014 | Agarwal | G03F 7/70283 716/52 |
| 2014/0358830 A1* | 12/2014 | Chiang | G06N 99/005 706/12 |
| 2015/0089457 A1* | 3/2015 | Agarwal | G03F 7/70466 716/52 |
| 2015/0112649 A1* | 4/2015 | Agarwal | G06K 9/00 703/2 |
| 2015/0153657 A1* | 6/2015 | Danilin | G03F 7/70516 355/52 |
| 2015/0213374 A1* | 7/2015 | Agarwal | G06F 17/50 706/12 |
| 2015/0356230 A1* | 12/2015 | Banerjee | G06F 17/5072 716/53 |

OTHER PUBLICATIONS

U.S. Appl. No. 14/057,588.
Demaris, David et al., "Fast source independent estimation of lithographic difficulty supporting large scale source optimization", Optical Microlithography XXV, edited by Will Conley, Proc. of SPIE, vol. 8326, 832614, 2012, 8 pages.
Ding, Duo et al., "Machine Learning Based Lithographic Hotspot Detection with Critical-Feature Extraction and Classification", ECE Dept. Univ. of Texas at Austin, TX 78712, 2009, 4 pages.
Drmanac, Dragolijub G. et al., "Predicting Variability in Nanoscale Lithography Processes", DAC '09, Jul. 26-31, 2009, San Francisco, CA, pp. 545-550.
Ghan, Justin et al., "Clustering and Pattern Matching for an Automatic Hotspot Classification and Detection System", SPIE vol. 7275, 727516, 2009, 11 pages.
Lai, Kafai, "Review of computational lithography modeling: focusing on extending optical lithography and design-technology co-optimization", Advanced Optical Technologies, vol. 1, Issue 4, Sep. 2012, pp. 249-267.
Ma, Ning et al., "Automatic Hotspot Classification Using Pattern-Based Clustering", SPIE vol. 6925, 692505, 2008, 10 pages.
Ma, Ning, "Automatic IC Hotspot Classification and Detection using Pattern-Based Clustering", Pd.D. Dissertation, Engineering—Mechanical Engineering, Graduate Division, University of California, Berkeley, Spring 2009, 106 pages.
Rosenbluth, Alan E. et al., "Intensive Optimization of Masks and Sources for 22nm Lithography", SPIE vol. 7274, 727409, 2009, 15 pages.
Rubinstein, Juliet A., "Pattern Matching for Advanced Lithographic Technologies", Ph.D. Dissertation, Engineering—Electrical Engineering and Computer Sciences, Graduate Division, University of California, Berkeley, Spring 2010, 89 pages.
Tam, Wing C. et al., "Systematic Defect Identification Through Layout Snippet Clustering", IEEE, International Test Conference, 2010, 10 pages.
Wuu, Jen-Yi et al., "Efficient Approach to Early Detection of Lithographic Hotspots Using Machine Learning Systems and Pattern Matching", SPIE vol. 7974, 79740U, 2011, 8 pages.
Yu, Yen-Ting et al., "Machine-Learning-Based Hotspot Detection Using Topological Classification and Critical Feature Extraction", DAC'13, Austin, Texas, May 29-Jun. 7, 2013, 6 pages.

* cited by examiner

FIG. 10

| HOTSPOT/ NON-HOTSPOT | PREDICTED CORRECTLY? |
|---|---|
| HS | N |
| HS | Y |
| HS | N |
| Non-HS | Y |
| Non-HS | Y |
| Non-HS | Y |
| Non-HS | Y |
| Non-HS | Y |
| Non-HS | Y |
| Non-HS | Y |
| Non-HS | Y |
| Non-HS | Y |
| HS | Y |
| HS | Y |
| HS | Y |
| HS | Y |
| Non-HS | Y |
| Non-HS | Y |
| HS | Y |
| HS | Y |

FIG. 11

| HOTSPOT/ NON-HOTSPOT | PREDICTED CORRECTLY? |
|---|---|
| HS | N |
| HS | Y |
| HS | N |
| Non-HS | Y |
| Non-HS | Y |
| Non-HS | Y |
| Non-HS | Y |
| Non-HS | Y |
| Non-HS | Y |
| Non-HS | Y |
| Non-HS | Y |
| Non-HS | Y |
| HS | Y |
| HS | Y |
| HS | Y |
| HS | Y |
| Non-HS | Y |
| Non-HS | Y |
| HS | Y |
| HS | Y |

DETECTING HOTSPOTS USING MACHINE LEARNING ON DIFFRACTION PATTERNS

BACKGROUND

The present application relates generally to an improved data processing apparatus and method and more specifically to mechanisms for detecting hotspots using machine learning on diffraction patterns.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Low $k_1$ lithography presents significant printability challenges for 22 nm technology. Design rules must guarantee manufacturable layouts over all possible enumerations of the design rule checker (DRC) clean shapes. The number of rules must be within a practical limit while still covering a wide range of complex two-dimensional optical interactions.

A lithographic hotspot is an area of the design that is likely to produce a printing error. The number of lithographic hotspots is growing exponentially with further scaling into low $k_1$ photolithography. This is because design rules are no longer adequate for guaranteeing printability of designs. Lithographic hotspots are most prominent in bi-directional layers like 1× metal. Hotspots cause design/process churn. It is critical to identify and eliminate hotspots early in the design process to reduce design/manufacturing costs.

SUMMARY

In one illustrative embodiment, a method, in a data processing system, is provided for detecting lithographic hotspots. The method comprises receiving a design layout. The method further comprises generating spatial pattern clips from the design layout. The method further comprises performing a transform on the spatial pattern clips to form frequency domain pattern clips. The method further comprises performing feature extraction on the frequency domain pattern clips to form frequency domain features. The method further comprises utilizing the extracted features on a set of training samples to train a machine learning classifier model. The method further comprises classifying a set of previously unseen patterns, based on frequency domain features of the previously unseen patterns using the trained machine learning classifier model, into hotspots and non-hotspots.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 10 is a table illustrating experimental results using the mechanism for detecting hotspots using machine learning on diffraction patterns in accordance with an illustrative embodiment;

FIG. 11 is a table illustrating experimental results with no guarantee that a randomly clipped layout will be centered around a hotspot in accordance with an example embodiment.

DETAILED DESCRIPTION

Figure 1:
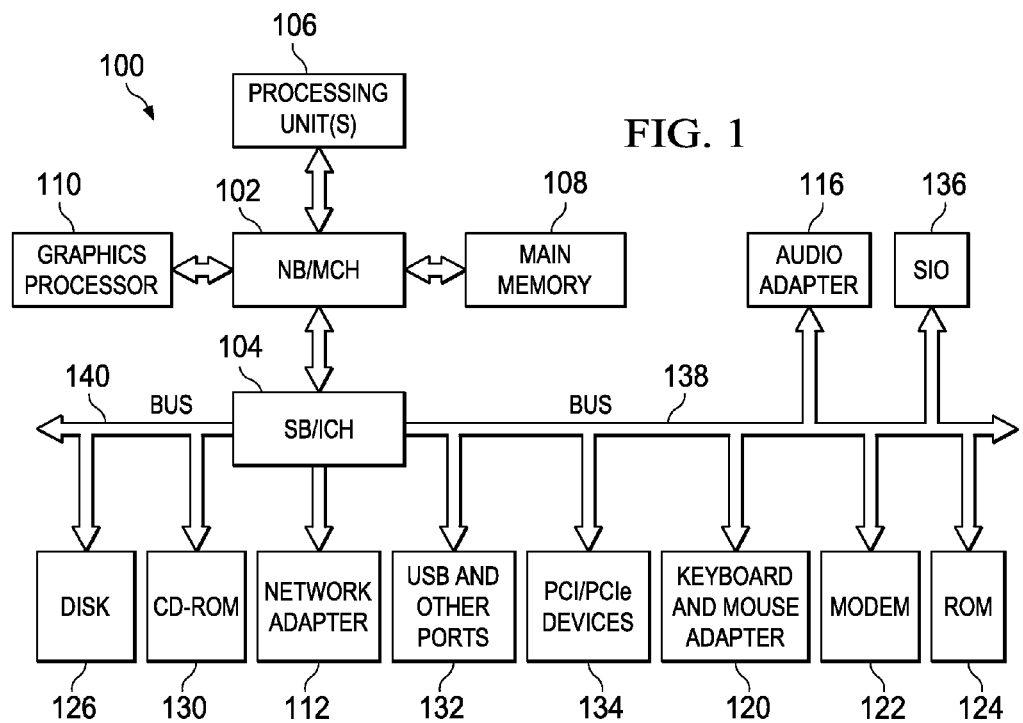
FIG. 1 is a block diagram of an example data processing system in which aspects of the illustrative embodiments may be implemented.

The illustrative embodiments provide mechanisms for detecting hotspots using machine learning on diffraction patterns. The illustrative embodiments may be utilized in many different types of data processing environments. In order to provide a context for the description of the specific elements and functionality of the illustrative embodiments, FIG. 1 is provided hereafter as example environments in which aspects of the illustrative embodiments may be implemented. It should be appreciated that FIG. 1 is only examples and are not intended to assert or imply any limitation with regard to the environments in which aspects or embodiments of the present invention may be implemented. Many modifications to the depicted environments may be made without departing from the spirit and scope of the present invention.

A "mechanism," as used herein, may be an implementation of the functions or aspects of the illustrative embodiments in the form of an apparatus, a procedure, or a computer program product. The mechanisms described herein may be implemented as specialized hardware, software executing on general purpose hardware, software instructions stored on a medium such that the instructions are readily executable by specialized or general purpose hardware, a procedure or method for executing the functions, or a combination of the above.

FIG. 1 is a block diagram of an example data processing system in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 100.

As a server, data processing system 100 may be, for example, an IBM® eServer™ System p® computer system, running the Advanced Interactive Executive (AIX®) operating system or the LINUX® operating system. Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device that is configured with flash memory to provide non-volatile memory for storing operating system files and/or user-generated data, for example. Essentially, data processing system 100 may be any known or later developed data processing system without architectural limitation.

Figure 2:
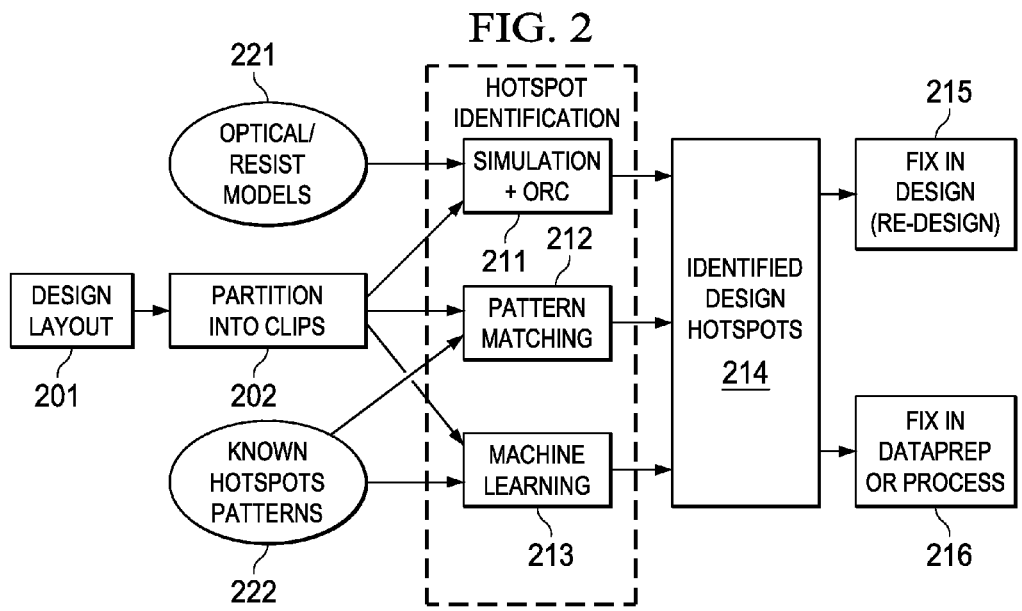
FIG. 2 is a block diagram illustrating an example model based hotspot detection mechanism along with associated triage activity.

An accepted way of detecting hotspots is using lithographic simulation over a full process window followed by optical rule checking (ORC). FIG. 2 is a block diagram illustrating an example model based hotspot detection mechanism. The mechanism receives design layout 201 and partitions the layout into clips 202. The mechanism provides the clips to simulation and ORC component 211, pattern matching component 212, and machine learning component 213.

Simulation and ORC component 211 also receives optical and resist models 221 and provides output to identified design hotspots 214. Pattern matching component performs rule-based pattern matching using previously identified hotspots 222 and provides output to identified design hotspots 214. Machine learning component 213 trains a model using known hotspot and non-hotspot patterns 222 and uses the model to predict hotspots. Machine learning component 213 provides output to identified design hotspots 214. Given the identified design hotspots 214, the mechanism then performs a fix in design (re-design) 215 and/or fix in data preparation or process 216.

Model-based hotspot detection 211 applies process window simulation using optical/resist models on design layouts followed by optical rule checks (ORC). Model-based hotspot detection provides high accuracy of detecting known hotspots and high accuracy of predicting hotspots. However, model-based hotspot detection has prohibitively high runtime and typically runs late in the design process, making redesign very expensive.

Pattern matching 212 identifies a set of known hotspots and performs pattern matching to find occurrences in the design layout. Pattern matching provides high accuracy of detecting known hotspots. Pattern matching also has very low runtime. Pattern matching can be run early in the design process, making re-design less expensive; however, pattern matching provides poor accuracy in predicting previously undiscovered hotspots.

Machine learning 213 uses a set of known hotspots to train a machine learning model and uses the model to detect hotspots. Machine learning has lower runtime than full model-based lithography simulation. Machine learning provides higher predictive accuracy than pattern matching. Machine learning can be used early in the design process to fix layouts. Machine learning component 213 may be a support vector machine (SVM) or a neural network. However, the accuracy of machine learning is highly dependent on feature encoding. Once a hotspot is discovered, it must be fixed in either design 215 or process 216. This leads to several iterations between hotspot detection and design/process churn, which makes the runtime and the predictive capability of the method extremely important.

Figure 3:
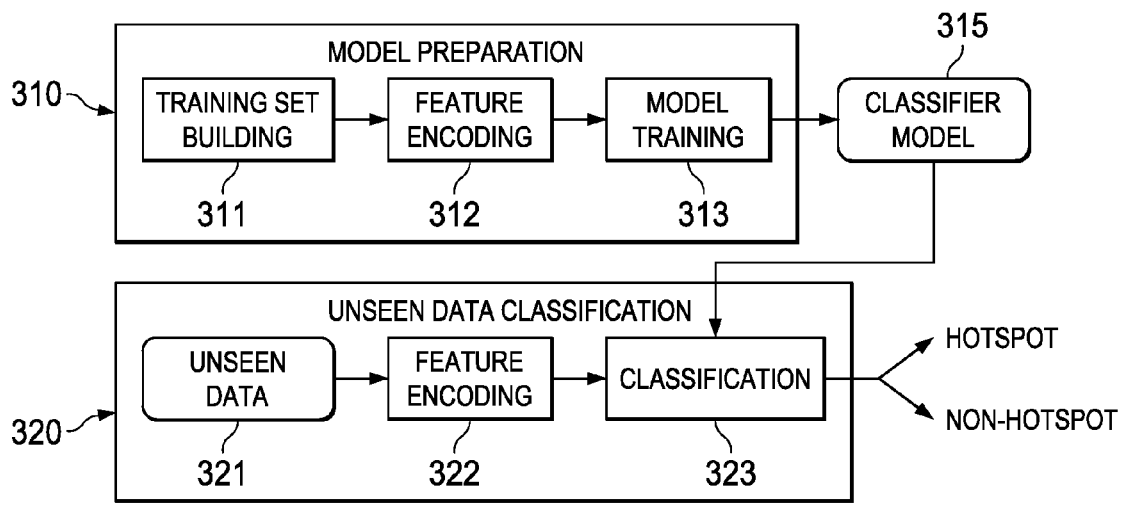
FIG. 3 is a block diagram illustrating a machine learning mechanism for hotspot detection.

FIG. 3 is a block diagram illustrating a machine learning mechanism for hotspot detection. Model preparation 310 comprises training set building component 311. Feature encoding component 312 receives the training set and converts the design shapes to a set of numbers, called a feature vector, which can be used in model training 313. Model preparation 310 develops a classifier model capable of distinguishing between hotspots and non-hotspots 315. Unseen data classification 320 comprises feature encoding component 322, which receives unseen data 321 and provides the corresponding feature vector to classification component 323. Classification component 323 classifies the previously unseen design into hotspot or non-hotspot.

Figure 4:
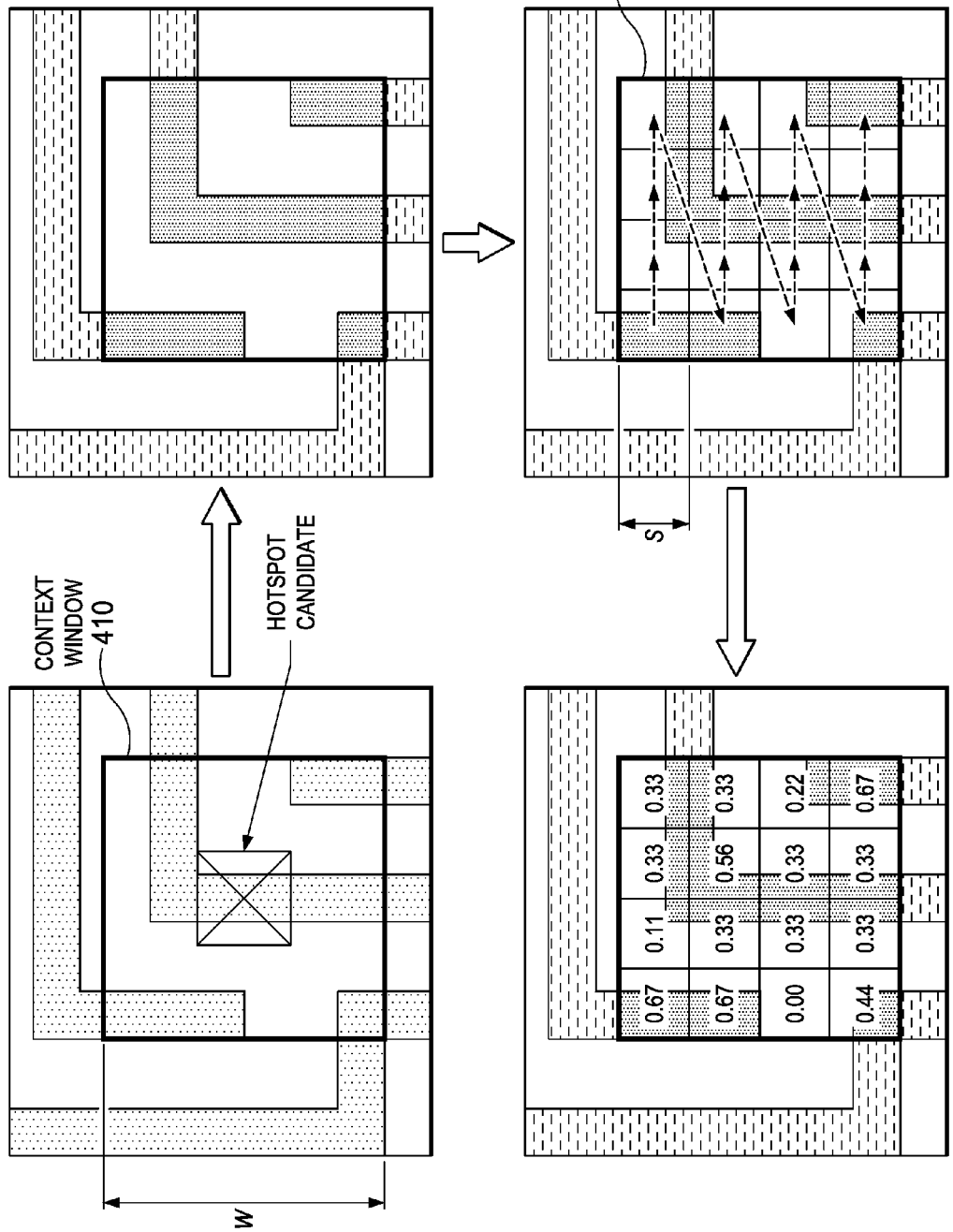
FIG. 4 illustrates spatial domain based feature encoding for model training.

FIG. 4 illustrates feature encoding for model training in the spatial domain, as seen in prior art. Using layout density, a feature encoding mechanism splits a layout window 410 into a grid using a sliding window 411. The mechanism computes the density of the layout within each grid. Each grid comprises a training vector. Other prior art mechanisms use optical proximity correction (OPC) fragmentation information, which comprises the training vector. Yet another mechanism performs a histogram distance transform, which is translation and rotation invariant. The mechanism replaces each "white" pixel with a distance to the nearest "black" pixel boundary. The mechanism uses the histogram as a training vector.

Such spatial domain based feature vectors have very little physical significance. Often, sparse layouts are more difficult to print than dense layouts, and this makes density-based feature vectors an inaccurate indicator of hotspots. Fragmentation strategies are constantly being modified during technology development, which would require too frequent updates of the fragment-based feature vector and, hence, of the model. Further, none of the existing hotspot classification models account for mask processing steps like retargeting and sub-resolution assist features (SRAF). Retargeting and SRAF insertion are accounted for indirectly through simulation results. Prediction accuracy can be improved by accounting for retargeting and SRAF insertion directly in the feature vector.

The results of spatial domain based feature encoding are highly dependent on anchoring of clips. Slight displacement of clip window changes feature encoding greatly. Usually, anchoring of clip extraction has to be centered on every structure or edge in the layout, which leads to a large number of clips for classification.

The illustrative embodiments provide a mechanism to perform feature encoding of layouts based on diffraction pattern (frequency domain), as opposed to spatial domain representation. The mechanism uses retargeting and rule-based SRAF generation information within feature encoding to improve accuracy.

The frequency domain representation is relevant from the physical point of view since the entire optical lithography system transmits the frequency information of the layout. This leads to improved accuracy of a machine learning model. SRAF insertions and retargeting may be captured in the machine learning model directly by performing the frequency domain transform after the two processes have been complete. The advantage of frequency domain representation is that it is not affected by small pattern shifts, because a shift in the spatial domain does not impact the magnitude of diffraction orders in the Fourier transform. The equation for a one-dimensional Fourier transform of a function, x(t), is as follows:

$$\Im[x(t \pm t_0)] = X(j\omega)e^{\pm j\omega t_0},$$

where $t_0$ is a shift in the spatial domain, $X(j\omega)$ is the frequency domain representation of x(t) before shift. The additional term $\exp(\pm j\omega t_0)$ in the frequency domain representation due to spatial domain pattern shift only impacts the phase of the function. The magnitude of frequency domain information does not change with spatial shifts or pattern translation, rotation, or reflection.

Figure 5:
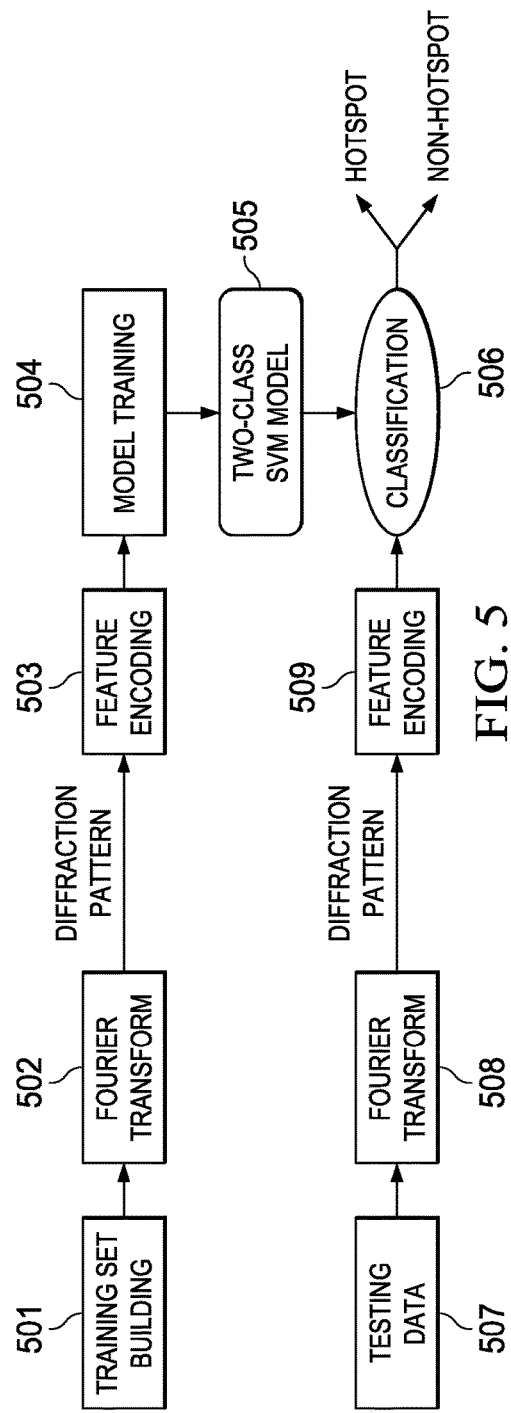
FIG. 5 is a block diagram illustrating a mechanism for diffraction pattern based machine learning in accordance with an illustrative embodiment.

FIG. 5 is a block diagram illustrating a mechanism for diffraction pattern based machine learning in accordance with an illustrative embodiment. Training set building 501 provides a set of training patterns, and Fourier transform 502 converts the training patterns into diffraction patterns (frequency domain representations). Fourier transform 502 may be a Fast Fourier Transform (FFT). FFT adds very little runtime overhead to the hotspot detection mechanism. Feature encoding component 503 provides feature encoding to model training component 504 based on the diffraction patterns. Feature encoding component 503 performs feature encoding based on the magnitude of the frequency domain samples. Model training component 504 trains a two-class support vector machine (SVM) model 505. The model 505 classifies the input features into hotspot or non-hotspot.

Fourier transform component 508 transforms the testing data 507 into diffraction patterns. Testing data comprises previously unseen patterns, which need to be classified as hotspots or non-hotspots. Feature encoding component 509 provides feature encoding of the diffraction patterns to classification component 506. The classification component 506 uses two-class SVM model 505 to classify the features from feature encoding component 509 into hotspot or non-hotspot. The testing data 507 is the data on which the model will be applied to predict hotspot or not.

Figure 6:
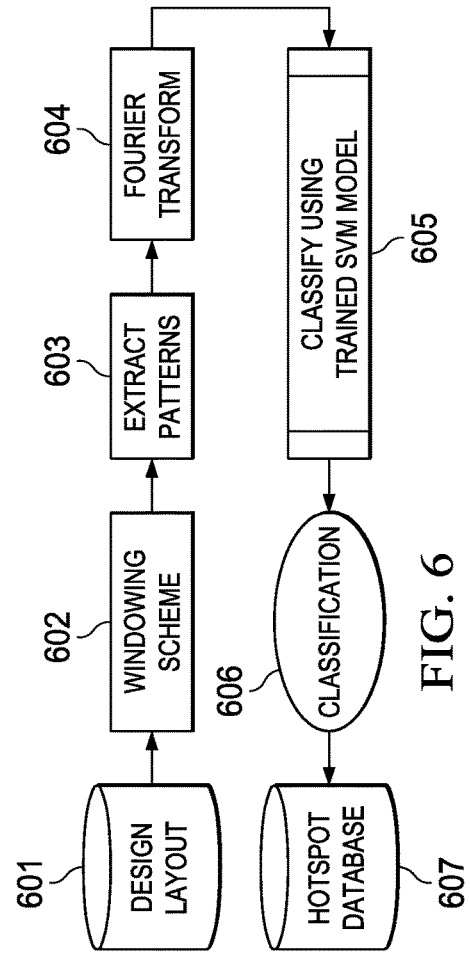
FIG. 6 is a block diagram illustrating a mechanism for extracting frequency domain layout clips and detecting design hotspots using a windowing scheme in accordance with an illustrative embodiment.

FIG. 6 is a block diagram illustrating a mechanism for extracting frequency domain layout clips and detecting design hotspots using a windowing scheme in accordance with an illustrative embodiment. The mechanism provides an integrated circuit (IC) design layout 601 to windowing scheme 602, which splits the layout into overlapping windows and ensures a hotspot pattern will exist in at least one window. Component 603 extracts patterns and Fourier transform 604 converts the extracted patterns into the frequency domain. Classification component 605 classifies each extracted pattern using a trained SVM model to generate classification 606. The mechanism provides each pattern classified as a hotspot to hotspot database 607.

Figure 7:
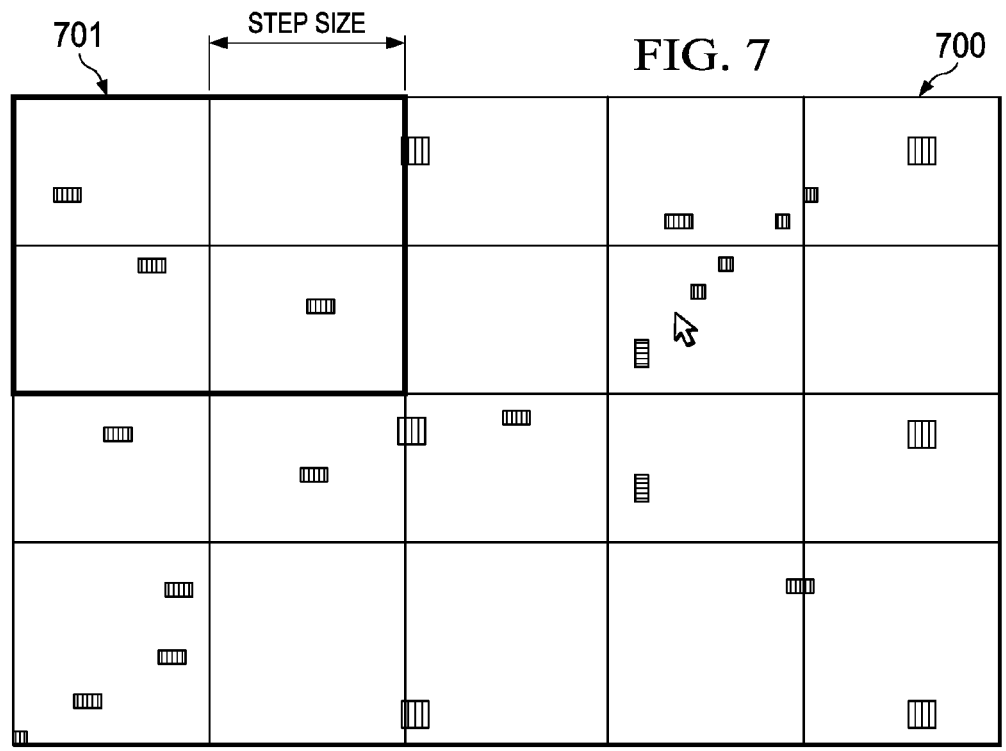
FIG. 7 illustrates a sliding window for extracting layout clips in accordance with an illustrative embodiment.

FIG. 7 illustrates a sliding window for extracting layout clips in accordance with an illustrative embodiment. The windowing scheme splits layout 700 into overlapping windows 701. The window 701 slides within layout 700 according to a predetermined step size. This windowing scheme leads to fewer clips compared to edge/polygon based anchoring. As long as a hotspot context appears within a clip, the location of the hotspot within the clip does not matter, because spatial shift does not affect the magnitude of diffraction orders in the Fourier transform.

Figure 8A:
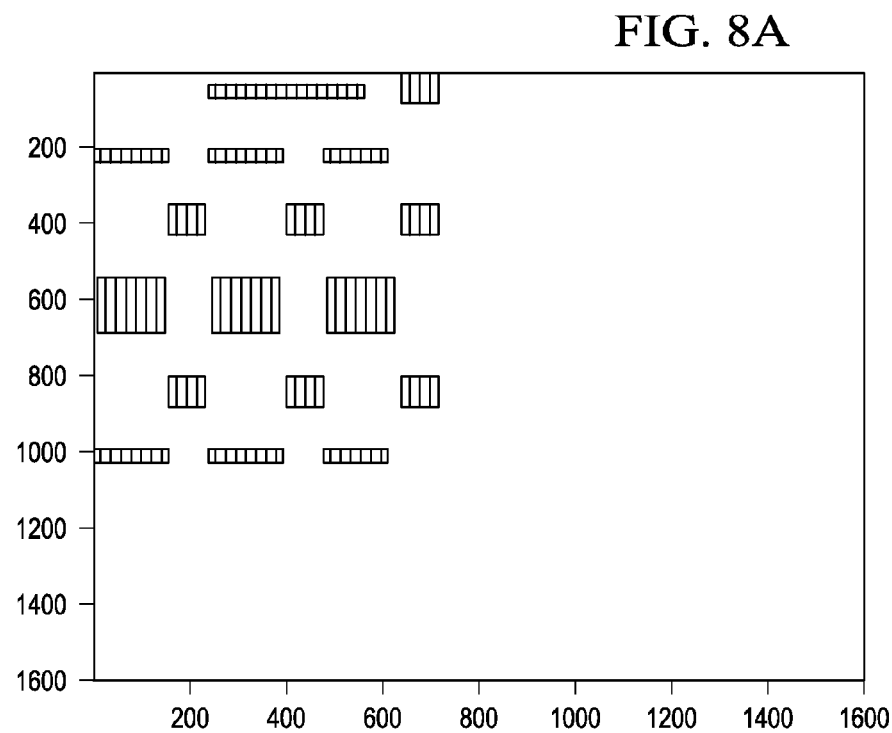
FIG. 8A illustrates a hotspot clip in the spatial domain in accordance with an illustrative embodiment.
Figure 8B:
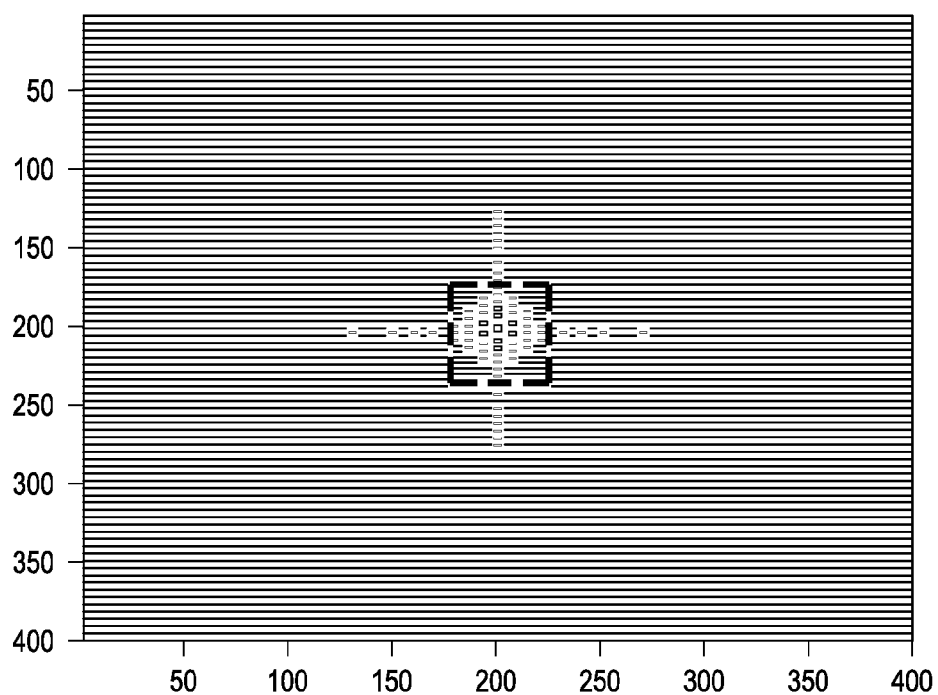
FIG. 8B illustrates a hotspot clip in the frequency domain in accordance with the illustrative embodiment.
Figure 8C:
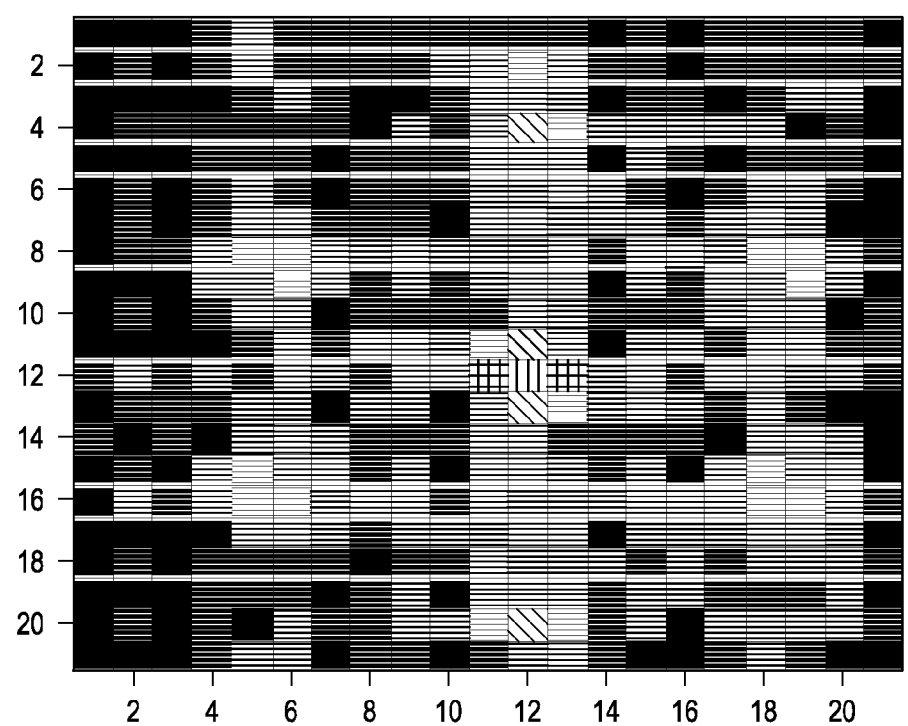
FIG. 8C illustrates an extracted feature vector in accordance with the illustrative embodiment.

In one embodiment, an input set consists of a clip around known hotspots. FIG. 8A illustrates a hotspot clip in the spatial domain in accordance with an illustrative embodiment. FIG. 8B illustrates a hotspot clip in the frequency domain in accordance with the illustrative embodiment. In accordance with the illustrative embodiment, the frequency domain feature extraction mechanism extracts a feature vector from the center of the diffraction pattern. FIG. 8C illustrates an extracted feature vector in accordance with the illustrative embodiment. The frequency domain feature extraction mechanism extracts a square window of N samples from the diffraction pattern. The value of N is derived empirically and depends on the numerical aperture (NA) of the imaging lens. The total feature vector size is $N^2$.

Figure 8D:
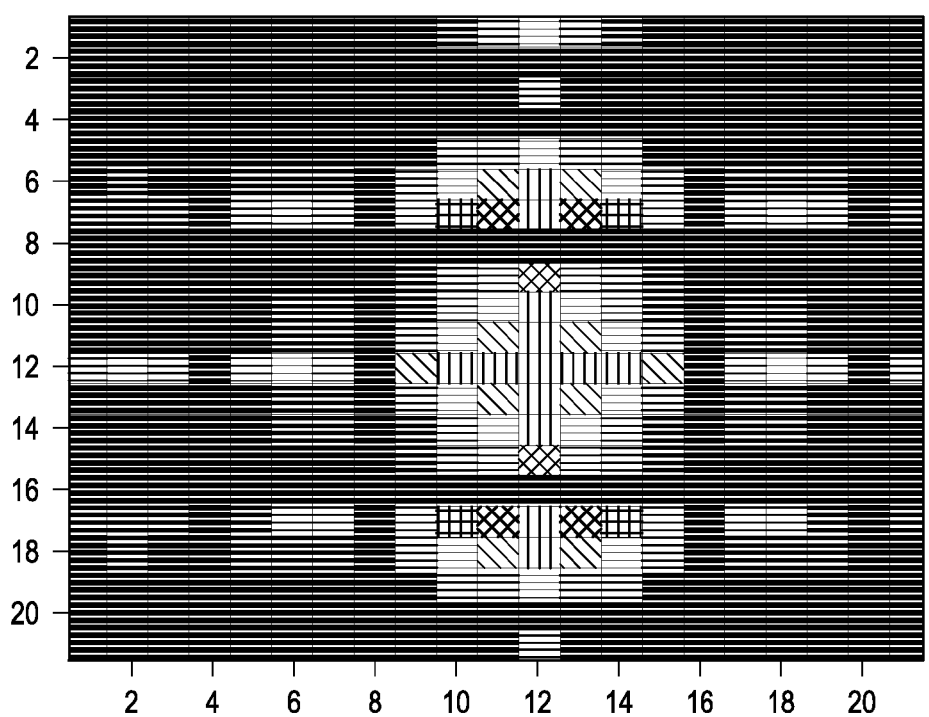
FIG. 8D illustrates a diffraction pattern for a metal layer in accordance with an example embodiment.

In one example embodiment, FIG. 8C may be a diffraction pattern for a via layer. FIG. 8D illustrates a diffraction pattern for a metal layer in accordance with an example embodiment.

A feature vector may be a carefully selected subset of the frequency domain information. This helps prune the feature vector and reduce runtime for model training and classification. One may perform selective sampling of the feature vector based on knowledge of illumination/optics. For example, off-axis illumination favors certain orders while entrance pupil is band-limited. One may also perform selective sampling based on knowledge of the layer of interest. For example, diffraction orders for parallel metal lines, as shown in FIG. 8D, tend to be distributed along major axes. Hence, the feature vector could be a window that focuses more on the major axes. For vias, as shown in FIG. 8C, the same diffraction orders may be distributed across the 45 degree axes, which would make the proposed N×N window feature vector more appropriate.

Feature vectors v are used to train the machine learning model. Based on maximum separating hyperplane (a.k.a. support vector machine) theory, let all hotspots be represented by −1 and all non-hotspots be represented by 1. The machine learning mechanism finds a hyperplane w such that clips are partitioned using maximum separation. This machine learning mechanism involves solving the following quadric equation:

$$\min \tfrac{1}{2} w^T w,$$

$$s.t.: w.v + b \geq 1, \forall v \in \text{nonhotspot},$$

$$w.v + b \leq -1, \forall v \in \text{hotspot}$$

where T is the matrix transpose and b is a constant representing the intercept of the hyperplane with the axes.

Figure 9:
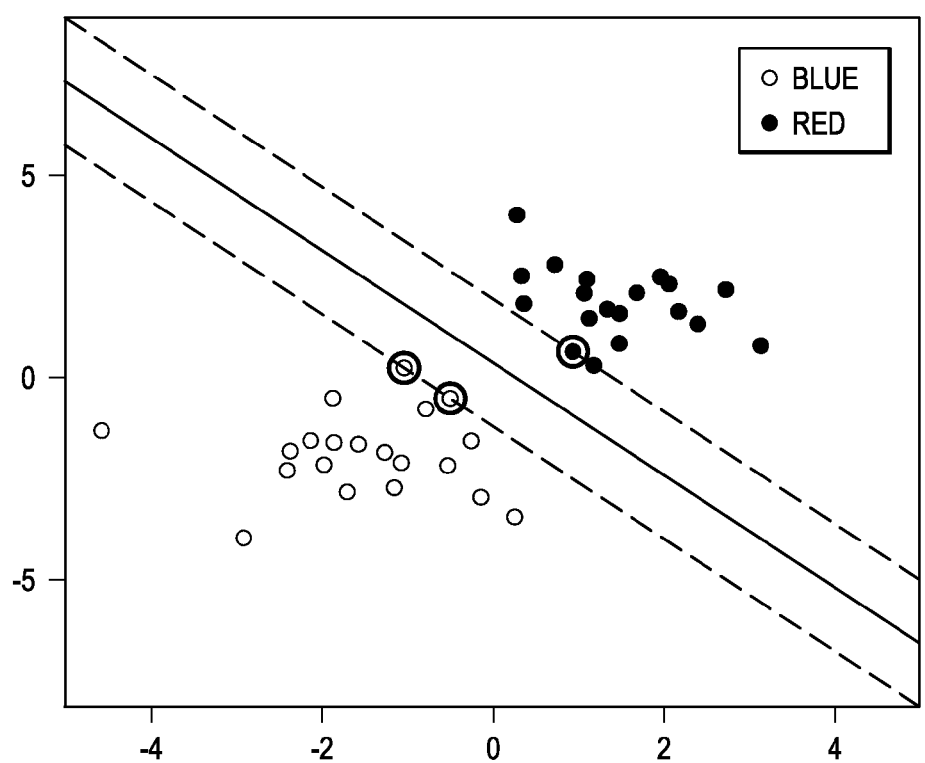
FIG. 9 illustrates a maximal separating hyperplane (also known as support vector machine) in accordance with an illustrative embodiment.

FIG. 9 illustrates a maximal separating hyperplane in accordance with an illustrative embodiment.

The mechanism of the illustrative embodiments classifies features using the machine learning model. Unseen samples may be classified using the trained hyperplane model ($[w_{trained} b_{trained}]$). The feature vector, based on the diffraction pattern of sample ($v_{unseen}$) is classified as follows:

If $w_{trained} \cdot v_{unseen} + b_{trained} < 0$, classify as hotspot; and

If $w_{trained} \cdot v_{unseen} + b_{trained} > 0$, classify as non-hotspot.

FIG. 10 is a table illustrating experimental results using the mechanism for detecting hotspots using machine learning on diffraction patterns in accordance with an illustrative embodiment. Sample vectors $V_x$ (V1, V2, V3) are selected for training, including twenty hotspot samples and twenty-six non-hotspot samples. These samples were chosen from an ORC review database. Twenty unseen samples were picked at random from the layouts and classified using the trained hyperplane model. As seen in FIG. 10, the mechanism provided 90% accuracy with no false positives and approximately 20% false negatives. Both numbers are based on a limited training set and are expected to improve with a larger training set.

FIG. 11 is a table illustrating experimental results with no guarantee that a randomly clipped layout will be centered around a hotspot in accordance with an example embodiment. This example would not presume knowledge of the hotspot. Other algorithms are sensitive to pattern shifts. As seen in the results shown in FIG. 11, the frequency domain classification is robust to shifts in the clipped patterns. The same twenty random patterns shifted by 40 nm in the X and Y directions do not change the classification results.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 12:
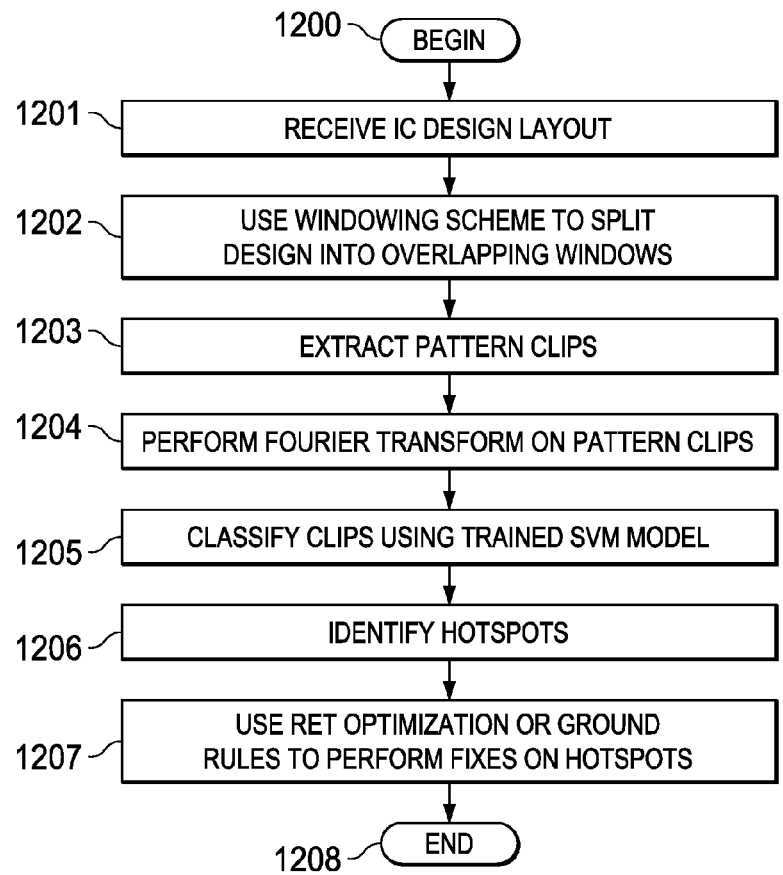
FIG. 12 is a flowchart illustrating operation of a mechanism for detecting lithographic hotspots using machine learning on diffraction patterns in accordance with an illustrative embodiment.

FIG. 12 is a flowchart illustrating operation of a mechanism for detecting lithographic hotspots using machine learning on diffraction patterns in accordance with an illustrative embodiment. Operation begins (block 1200), and the mechanism receives an integrated circuit (IC) design layout (block 1201). The mechanism uses a windowing scheme to split the design into overlapping windows (block 1202). Then, the mechanism extracts pattern clips from the windows (block 1203).

The mechanism performs a Fourier transform on the pattern clips to form diffraction patterns or frequency domain representations of the pattern clips (block 1204). The mechanism then classifies the clips using a trained support vector machine (SVM) model or other model, such as a neural network or the like (block 1205).

Thereafter, the mechanism identifies hotspots (block 1206). The mechanism may use resolution enhancement techniques (RET) optimization or ground rules to perform fixes on the hotspots in the design (block 1207). Then, operation ends (block 1208).

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for detecting lithographic hotspots, the method comprising:
    receiving a design layout;
    generating spatial pattern clips from the design layout using a sliding window to split the design layout into overlapping windows;
    performing a transform on the spatial pattern clips to form frequency domain pattern clips;
    performing feature extraction on the frequency domain pattern clips to form frequency domain features;
    utilizing the extracted features on a set of training samples to train a machine learning classifier model; and
    classifying a set of previously unseen patterns, based on frequency domain features of the previously unseen patterns using the trained machine learning classifier model, into hotspots and non-hotspots.

2. The method of claim 1, wherein performing feature extraction comprises extracting a square window of N by N samples from a given frequency domain pattern clip, wherein N is based on a numerical aperture of an imaging lens used in a photolithography process.

3. The method of claim 1, wherein performing feature extraction comprises extracting a frequency domain feature based on a subset of a given frequency domain pattern clip using layer, illumination, and optics information.

4. The method of claim 1, further comprising:
    training the machine learning classifier model using a support vector machine.

5. The method of claim 4, wherein training the machine learning, classifier model comprises:
    finding a hyperplane w such that features partitioned using maximum separation.

6. The method of claim 5, wherein finding the hyperplane comprises solving the following quadric equation:

$$\min \tfrac{1}{2} w^T w,$$

$$s.t.: w.v+b \geq 1, \forall v \in \text{nonhotspot},$$

$$w.v+b \leq -1, \forall v \in \text{hotspot},$$

where T is the matrix transpose and b is a constant representing the intercept of the hyperplane with the axes.

7. The method of claim 1, wherein the trained machine learning classifier model comprises a support vector machine or a neural networks.

8. The method of claim 1, further comprising:
    performing resolution enhancement technique optimization or ground rules to fix identified hotspots.

9. A computer program product comprising a computer readable storage medium having a computer readable program stored therein, wherein the computer readable program, when executed on a computing device, causes the computing device to:
    receive a design layout;
    generate spatial pattern clips from the design layout using a sliding window to split the design layout into overlapping windows;
    perform a transform on the spatial pattern clips to form frequency domain pattern clips;
    perform feature extraction on the frequency domain pattern clips to form frequency domain features;
    utilize the extracted features on a set of training samples to train a machine learning classifier model; and
    classify a set of previously unseen patterns, based on frequency domain features of the previously unseen patterns using the trained machine learning classifier model, into hotspots and non-hotspots.

10. The computer program product of claim 9, wherein performing feature extraction comprises extracting a square window of N by N samples from a given frequency domain pattern clip, wherein N is based on a numerical aperture of an imaging lens used in a photolithography process.

11. The computer program product of claim 9, wherein the computer readable program further causes the computing device to:
    training the machine learning classifier model using a support vector machine.

12. The computer program product of claim 11, wherein training the machine learning classifier model comprises:
    finding a hyperplane w such that features are partitioned using maximum separation.

13. The computer program product of claim 12, wherein finding the hyperplane comprises solving the following quadric equation:

$$\min \tfrac{1}{2} w^T w,$$

$$s.t.: w.v+b \geq 1, \forall v \in \text{nonhotspot},$$

$$w.v+b \leq -1, \forall v \in \text{hotspot},$$

where T is the matrix transpose and b is a constant representing the intercept of the hyperplane with the axes.

14. An apparatus, comprising:
    a processor; and
    a memory coupled to the processor, wherein the memory stores instructions which, when executed by the processor, cause the processor to:
    receive a design layout;
    generate spatial pattern clips from the design layout using a sliding window to split the design layout into overlapping windows;
    perform a transform on the spatial pattern clips to form frequency domain pattern clips;
    perform feature extraction on the frequency domain pattern clips to form frequency domain features;
    utilize the extracted features on a set of training samples to train a machine learning classifier model; and
    classify a set of previously unseen patterns, based on frequency domain features of the previously unseen patterns using the trained machine learning classifier model, into hotspots and non-hotspots.

15. The apparatus of claim 14, wherein performing feature extraction comprises extracting a square window of N by N samples from a given frequency domain pattern clip, wherein N is based on a numerical aperture of an imaging lens used in a photolithography process.

16. The apparatus of claim 14, wherein the computer readable program further causes the computing device to:
    training the machine learning classifier model using a support vector machine.

17. The apparatus of claim 16, wherein training the machine learning classifier model comprises:

finding a hyperplane w such that features are partitioned using maximum separation by solving the following quadric equation:

$\min 1/2 w^T w,$ $s.t.: w.v+b \geq 1, \forall v \in \text{nonhotspot},$ $w.v+b \leq -1, \forall v \in \text{hotspot},$ where T is the matrix transpose and b is a constant representing the intercept of the hyperplane with the axes.

18. The computer program product of claim 9, wherein performing feature extraction comprises extracting a frequency domain feature based on a subset of a given frequency domain pattern(clip using layer, illumination, and optics information.

19. The computer program product of claim 9, wherein the computer readable program further causes the computing device to:

performing resolution enhancement technique optimization or ground rules to fix identified hotspots.

20. The apparatus of claim 14, wherein performing feature extraction comprises extracting a frequency domain feature based on a subset of a given frequency domain pattern clip using layer, illumination, and optics information.

* * * * *